Sept. 14, 1965 M. KAHN 3,206,647

SEMICONDUCTOR UNIT

Filed Oct. 31, 1960

MANFRED KAHN
*INVENTOR.*

BY Connolly and Hutz

HIS ATTORNEYS

United States Patent Office 3,206,647

Patented Sept. 14, 1965

3,206,647
SEMICONDUCTOR UNIT

Manfred Kahn, North Adams, Mass., assignor to Sprague Electric Company, North Adams, Mass., a corporation of Massachusetts Filed Oct. 31, 1960, Ser. No. 66,079
1 Claim. (Cl. 317—101)

Figure 1:
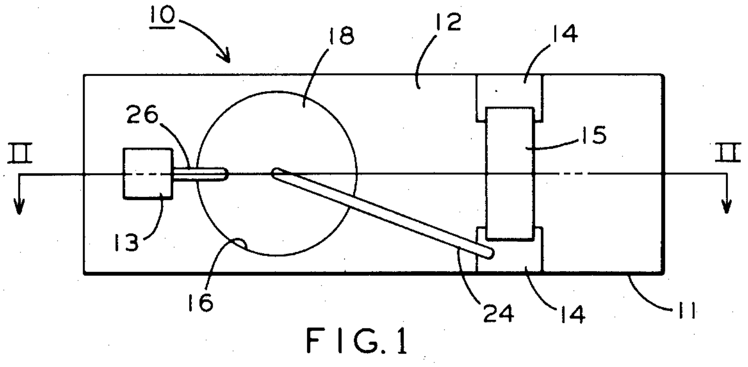

This invention relates to plastic encapsulated or potted semiconductor devices as part of a component assembly, such as transistors or diodes in microcircuits.

More particularly, the invention relates to such a component assembly wherein a desiccant is dispersed within the potting compound of the component assembly and may be concentrated immediately adjacent the electrodes of the semiconductor unit.

Potted semiconductors have a number of important advantages which include stability of operating characteristics for the lifetime of the device, and capability of being produced in quantity while preserving uniformity and predictability of operation. Particularly, the potting technique minimizes the possibility of contamination of the transistor device during use while maintaining required standards of electrical insulation. The potted semiconductors are combinable in microcircuits, such as ceramic based microcircuits, together with other components to provide a miniaturization of electronic circuitry.

In accordance with such technique, the components of a semiconductor device are rigidly held in a predetermined and critical dimensional relationship by embedding the semiconductive device in a suitable plastic material such as a synthetic resin chosen from a high polymer product. The components are assembled on and in a ceramic substrate to form a component assembly which is preferably thereafter housed in a metal shield or can. The can seals off the material from the surrounding atmosphere.

This invention relates to the use of, and has as an object, an improved potting composition for the potting of transistors or other semiconductors. The improved potting composition includes a desiccant material, such as silica gel or a zeolite, which is dispersed throughout a synthetic plastic material. The dessicant acts in a manyfold manner to provide advantages not found within the prior art. It serves both as a desiccant and an entrapment for substances which would be impurities for the semiconductive materials forming the transistor. Hence no extra space is required for including a separate desiccant material within the housing or can. The preferred desiccants of the present invention serve also as fillers to stiffen soft encapsulants of synthetic plastic material. The desiccant also serves to modify the temperature coefficient of thermal expansion and the temperature cycling properties.

A further object of this invention is a component assembly for a microcircuit in which electronic components are combined with an improved potting compound for the assembly.

Still another object of this invention is to provide an improved and novel semiconductor device such as a transistor which includes the potting compound of the present invention as described above.

The preferred desiccants for this invention include silica gel and the zeolite. Silica gel is a form of collodial silica, like coarse sand in appearance, but possessing many fine pores and therefore extremely absorbent. The zeolites have the same general appearance, and possess the same property of high absorption. The preferred zeolites are calcium alumino silicate and sodium alumino silicate.

A typical component assembly for this invention is made up of a ceramic dielectric substrate, resistors deposited on the substrate, semiconductive devices such as transistors and diodes mounted in cavities within the substrate, and interconnections between the components. The semiconductive devices are embedded in a solid potting composition having dispersed therein silica gel in sufficient concentration as to provide a means whereby moisture and other impurities are stopped from making contact with the semiconductor itself. The component assembly is housed or sealed in a suitable metal can.

Figure 2:
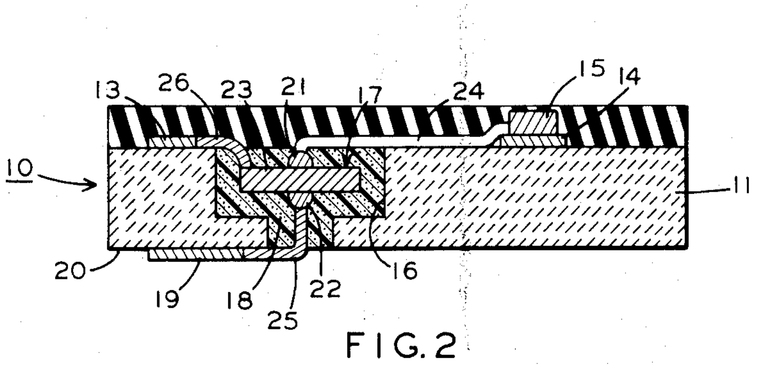

A further understanding of the invention can be achieved from a study of the following description and drawing wherein:

FIG. 1 shows a plan view of a component assembly according to this invention; and FIG. 2 shows a sectional view of the component assembly of FIG. 1 taken along lines II—II of FIG. 1.

In FIGURE 1 a component assembly 10 is shown made up of a ceramic substrate 11 having disposed on its upper surface 12 fired on electrodes 13 and 14, and a resistor 15 between the electrodes 14. A cavity 16 is formed intermediate the electrodes 13 and the pair of electrodes 14.

As shown in FIGURE 2 the cavity contains a transistor 17. The transistor 17 is centered in the cavity 16 and is surrounded by a potting compound 18. An electrode 19 is mounted on an under surface 20 of the ceramic substrate 11. The transistor is made up of an emitter 21, a collector 22 and a base 23. One of the electrodes 14 for resistor 15 and the emitter 21 are connected by an interconnection 24. The electrode 19 and the collector 22 are connected by an interconnection 25, and the base 23 is connected to the electrode 13 by an interconnection 26.

The insulating potting material 18 is used to hold the transistor 17 rigidly in place. It is important that the potting material serves to insulate and avoid short circuiting of the interconnections 24, 25 and 26. The preferred potting material 18 is a thermoplastic material, such as acrylic resins and polystyrene resins. Thermosetting materials which may be used are silicon rubber, epoxy resins, and vinyl functional dimethyl silicones. The important characteristic of these suitable plastic materials is that they have a high specific resistance when cured and a relatively high dimensional stability during and after curing. Further these plastic materials have a minimum to no effect on the operating characteristics of the transistor as a result of contact with the semiconductor at the curing temperature or on operating life.

A great number of small filler particles of desiccant, e.g. silica gel, are dispersed in this plastic potting material 18, as is shown in FIG. 2 by the uniformly distributed stippling. The silica gel particles have screen sizes between about 300 and 500. The silica gel particles are preferably concentrated in a portion of the potting compound 18 adjacent the emitter 21, the collector 22 and the base 23.

The concentrated arrangement of the filler particles in the plastic is then made permanent, incident to the known operation of converting the plastic into a solid, at temperatures suitable for this purpose. The exact thermoplastic or thermosetting procedures, temperatures, periods, etc. are well known in the plastic art and need not be specified herein. In many applications of the present method, the heating of the entire mixture must also be controlled to avoid overheating of local portions thereof, which would injure the semiconductor or the potting compound, or both. Sometimes the heating must be performed with particular care, in order to avoid redispersion of the concentrated filler particles at the start of the curing operation.

A three dimensional microcircuit assembly is achieved by stacking plate 10 with other plates supporting electronic components. The stacked plates are electrically interconnected and cast in a plastic material which is compatible with plastic 18 and which may also have desiccant dispersed therein. This assembly is adapted for insertion in a suitable enclosure, e.g. a metal can, which may be effectively hermetically sealed.

The advantage of this means of component assembly is readily apparent. It provides a maximum of design flexibility and high volume efficiency. This invention contributes to these advantages by placing transistors in close proximity to other electronic components while protecting the semiconductor material from the impurities to which the semiconductor might be subjected emanating from the other electronic components.

Obviously many modifications and variations of the present invention are possible in the light of the above teachings. For example, the preferred dessicants are replaceable with another hydrophilic substance having equivalent characteristics, as for example, aluminum oxide. It is, therefore, to be understood that within the scope of the appended claim the invention may be practiced otherwise than as specifically described.

What is claimed is:

In an electronic assembly minimizing contamination of a transistor in a plastic encapsulation, the combination of a substrate, an uncased transistor mounted in a cavity in said substrate, at least one additional electronic component mounted on said substrate in close proximity with said transistor, a body of solid plastic material of low electrical conductivity surrounding said transistor and said additional electronic component so as to mount said transistor in said substrate and encapsulate the transistor and the component with the transistor and the additional component in contact with said plastic material, a collector electrode of said transistor contained in said plastic material, particles capable of absorbing moisture and impurities selected from the group consisting of silica gel, aluminum oxide and zeolite embedded in and dispersed throughout said plastic material surrounding said transistor having a major portion of the embedded particles surrounding said collector electrode, said electronic assembly being so constructed and arranged that said plastic material and said dispersed particles embedded in said plastic material are interposed as the only protection against impurities positioned between said transistor and said additional electronic component.

References Cited by the Examiner

UNITED STATES PATENTS

| | | | |
|---|---|---|---|
| 2,572,801 | 10/51 | Casellini | 317—236 |
| 2,900,701 | 8/59 | Coggins | 317—236 |
| 2,945,163 | 7/60 | Kilby | 317—101 |
| 2,945,992 | 7/60 | Bollert | 317—234 |
| 2,998,556 | 8/61 | Pritchard et al. | 174—52 |

JOHN F. BURNS, *Primary Examiner.*

SAMUEL BERNSTEIN, E. JAMES SAX, *Examiners.*